United States Patent
Rings et al.

(10) Patent No.: US 11,237,296 B2
(45) Date of Patent: Feb. 1, 2022

(54) WELL FRACTURE MODELLING

(71) Applicant: Roxar Software Solutions AS, Stavanger (NO)

(72) Inventors: Daniel Christoph Rings, Oxford (GB); Michele Taroni, Oxford (GB)

(73) Assignee: Roxar Software Solutions AS, Stavanger (NO)

(*) Notice: Subject to any disclaimer, the term of this patent is extended or adjusted under 35 U.S.C. 154(b) by 45 days.

(21) Appl. No.: 16/642,221

(22) PCT Filed: Sep. 7, 2018

(86) PCT No.: PCT/EP2018/074110
§ 371 (c)(1),
(2) Date: Feb. 26, 2020

(87) PCT Pub. No.: WO2019/048599
PCT Pub. Date: Mar. 14, 2019

(65) Prior Publication Data
US 2020/0408951 A1 Dec. 31, 2020

(30) Foreign Application Priority Data
Sep. 8, 2017 (NO) .................................. 20171447

(51) Int. Cl.
*G01V 99/00* (2009.01)
*E21B 47/06* (2012.01)
*E21B 47/10* (2012.01)
*E21B 49/08* (2006.01)
*E21B 43/26* (2006.01)

(52) U.S. Cl.
CPC ............ *G01V 99/005* (2013.01); *E21B 47/06* (2013.01); *E21B 47/10* (2013.01); *E21B 49/08* (2013.01); *E21B 43/26* (2013.01); *E21B 2200/20* (2020.05)

(58) Field of Classification Search
CPC ............ G01V 99/005; G01V 2210/646; E21B 47/06; E21B 47/10; E21B 49/08; E21B 43/26
See application file for complete search history.

(56) References Cited

U.S. PATENT DOCUMENTS

| 7,925,482 | B2 | 4/2011 | Kennon et al. |
| 8,682,628 | B2 | 3/2014 | Garfield et al. |
| 9,390,204 | B2 | 7/2016 | Garfield et al. |
| 10,605,054 | B2 * | 3/2020 | Klenner ............... E21B 43/26 |

FOREIGN PATENT DOCUMENTS

CA 2838190 A1 6/2014

OTHER PUBLICATIONS

Donald W. Peaceman, "fundamentals of numerical reservoir simulation", Developments in Petroleum Science, vol. 6, Elsevier Scientific Publishing Company, 1977, ISBN: 0-444-41578-5 (vol. 6), ISBN: 0-444-41625-0 (series).

* cited by examiner

*Primary Examiner* — Manuel A Rivera Vargas
(74) *Attorney, Agent, or Firm* — The Ollila Law Group LLC

(57) ABSTRACT

The present disclosure relates to numerical simulation of hydrocarbon reservoirs, in particular a method for modelling the fluid flow in fractures close to a well bore. The present invention describes a fast solver for multi-component multi-phase flow and its embodiment on a programmable electronic automaton.

11 Claims, 2 Drawing Sheets

WELL FRACTURE MODELLING

BACKGROUND OF THE INVENTION

Inducing fractures around wells to enhance fluid flow is a common technique used in the operation of hydrocarbon reservoirs. It predates so called "fracking" by many decades, which refers to hydrocarbon recovery from unconventional reservoirs such as shale. In general, a mixture of fracturing liquid and proppant is injected into a well at high pressure. This creates a set of (usually) vertical fractures propagating from the wellbore into the surrounding rock, which—thanks to the proppant—remains open even after the injection ceases. Consequently, the influence region of the well effectively grows allowing enhanced production of hydrocarbons without drilling new wells.

Multi-phase multi-component reservoir simulators are all based on numerically solving a set of partial differential equations derived from Darcy's law. At each time step, iterative methods, generally Newton's method, are employed to minimise a multidimensional residual function $r(x)$ of the sought solution x. By definition, $r(x)=0$ implies that x is an exact solution of the differential equations. Depending on the type of discretisation used to solve these equations, i.e., explicit, mixed explicit/implicit or fully implicit, different mathematical stability criteria apply which limit the methods' efficiency. That is, they set upper bounds on the time step $\Delta t$ by which the solution can be propagated, $x(t) \rightarrow x(t+\Delta t)$. Broadly speaking, implicit methods allow larger $\Delta t$ than explicit methods at the cost of more equations to solve, and $\Delta t$ scales roughly proportional to the smallest grid cell volume within the reservoir.

Compared to typical grid cell sizes and fluid fluxes inside porous rock, fractures are regions of small volume and high flux. This is why reservoir simulation software has so far struggled to incorporate well fractures in a both efficient and accurate manner into the calculation of reservoir fluid flows. Some existing models are overly simplistic to make accurate predictions. Other models base their accuracy on fine-grained discretisation of the reservoir around the fractures, which usually comes at high performance costs. Prior art comprises Part-of-grid approach
This is the most straight-forward implementation of modelling flow into and inside well fractures. It consists of tailoring the reservoir grid such that it resolves the fractures by containing thin highly permeable cells along the fractures. No modification of the solution method applies. In general, this approach suffers from very small time steps $\Delta t$ or convergence problems of the iterative solver due to the small volume of the fracture grid cells. U.S. Pat. No. 7,925,482 B2 [1] describes a finite-element solver for a reservoir with hydraulic fractures. To so overcome some of the efficiency limitations, it applies some phase mixing rule inside the fracture to effectively solve a single-phase finite-element problem.

Well-type approach
This approach is described in U.S. Pat. No. 9,390,204 B2 [2] and in more abstract terms in U.S. Pat. No. 8,682, 628 B2 [3]. It adapts the well-known multi-segmented well method to solve fluid flow inside a wellbore to flow inside a fracture. It effectively models a fracture as a pipe with staggered connections into the reservoir and defined friction between the entry points that limits flow along the fracture. The coupled reservoir-wells-fractures system is solved in a nested three-stage loop, with an iterative solution required to obtain the multi-phase multi-component flows at each stage.

What is needed is a method to calculate multi-component multi-phase flow through the narrow aperture of well fractures which is accurate but does not impede on the overall performance of the reservoir simulator.

Further, a tool for setting up and controlling a large system of well fractures is required. Finally, the wealth of simulation data obtained when simulating such a system necessitates a visual monitoring and data evaluation platform.

OBJECTS OF THE INVENTION

It is an object of this invention to develop a novel method for fractures along and across well trajectories that combines both significant speed and significant accuracy. The object is obtained using a method as defined above characterized as presented in the accompanying independent claim.

Both the part-of-grid method and the well-type method referred to in the background are too slow for practical use on oil fields with many wells.

It is embedded in a complete visual workflow from well fracture planning to evaluation of the simulation results. The main features are:
1. Complete lifecycle modelling of well fractures, from user-friendly graphical setup of fracturing events over embedded simulation in the Tempest MORE reservoir simulator to 3D visualisation of fractures and their properties.
2. Fully coupled well/fracture system with non-iterative solution of the fracture flows.
3. User-defined resolution of the internal fracture grid, independent of the reservoir grid resolution with computational cost limited by the number of internal fracture grid nodes only.
4. Versatile formulation allows coupling with external modelling tools for fracture properties.

SUMMARY OF THE INVENTION

The present invention is related to the well-type approach discussed in U.S. Pat. No. 9,390,204 B2 and U.S. Pat. No. 8,682,628 B2, i. e. we solve the well/fracture subsystem in each iteration i of the reservoir solver, based on the state $x_i$. In order to overcome the performance limitations generally arising from fine grid discretisation, our invention does not require separate fracture solver iterations inside the iterative well solver. Our method finds the fracture solution by solving a small linear system of equations. By construction, this system is guaranteed to have a solution, which is computed by an efficient decomposition algorithm—adding to the overall robustness of the model. The full algorithm is schematically depicted in FIG. 1.

BRIEF DESCRIPTION OF THE DRAWINGS

For a more complete understanding of the invention, reference is made to the following description and accompanying drawings, which illustrate the invention by way of examples.

DETAILED DESCRIPTION OF THE PREFERRED EMBODIMENTS

According to the present invention, the fluid flows in the reservoir are solved iteratively. The details of the numerical method in general can be found in the book by D. Peaceman on Fundamentals of Numerical Reservoir Simulation [4] and the innovation presented here lies in the calculation of the fracture flows and their coupling to the formation and well flows. To evolve the total system from time t to time t+Δt, an iteration over the following instructions is performed until a solution within the chosen overall error tolerance is found or a maximum number of iterations has been reached. In the latter case, the time step size Δt is considered unsolvable and the procedure is repeated with a new time step Δt'<Δt. The iteration instructions are:

1. Calculate the net component and associated fluid volume changes for each reservoir cell. In- and outflows are from and to other reservoir cells or well connections, and their calculation may entail
2. Iterative solution of each well given the boundary conditions set by the state of all connected reservoir cells. Each well solution is obtained by varying the well pressure until all well control targets are met within a given tolerance or a maximum number of iterations has been reached. Solving each well may entail
3. A single direct (non-iterative) calculation of the internal well fracture pressures under the boundary conditions set by the well pressure at the first well iteration and the state of all reservoir cells connected to the fracture. The found solution is scaled to match the well pressure in each subsequent well iteration. This solution determines the component rates from the reservoir through the fracture into the well. The following section describes this method in detail.

Figure 2:
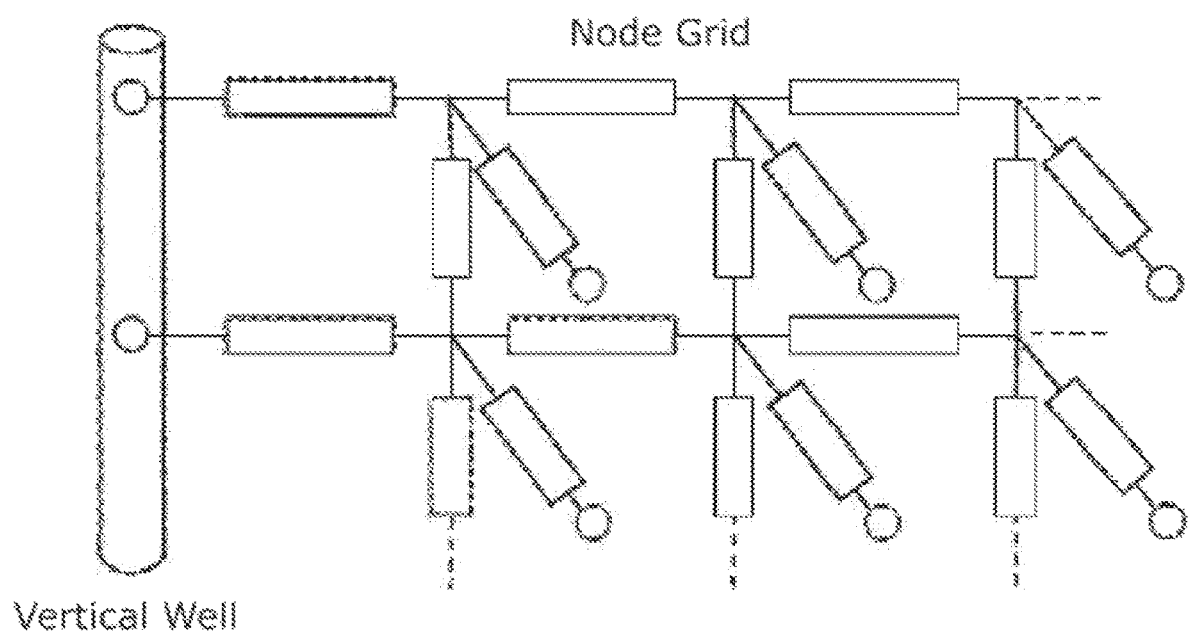
FIG. 2 illustrates the node grid used according to the invention.

The well fracture is modelled as a network of nodes i bearing pressures $p_i$ and links (i,j) bearing voidage flows $\dot{V}_{ij}$ with unknown pressures $p^{in}$ on the internal nodes and unknown flows $\dot{V}^{ex}$ between internal and external nodes. See FIG. 2 for an illustration of the different node types.

Solving a well fracture happens in three stages:

1. We find the internal node pressures by modelling single phase Darcy flow between neighbouring network nodes, $$\dot{V}_{ji} = \dot{V}_{j \to i} = \mu_{ji}[p_j - p_i - \rho_{ji}(d_j - d_i)], \quad (1)$$

where $\mu_{ij} = \mu_{ji}$ denotes the voidage conductance for the link between nodes i and j, and $\rho_{ij} = \rho_{ji}$ is the average fluid density in that link.

2. For each external node j associated with a reservoir cell that has a positive drawdown, we calculate the component flows to the adjacent internal node i from the drawdowns determined in the first step, $$q_{ji}^c = q_{j \to i}^c = ccf_j \cdot m_j^c[p_j^e - p_i - \rho_{ji}(d_j - d_i)], \quad (2)$$

with $ccf_j$ the geometrical connectivity factor and $m_j^c$ the component mobility for node j. The former is a purely geometrical number describing the intersection between fracture plane and reservoir grid cell j while the latter encodes the fluid properties in cell j.

3. For each external node with a negative drawdown, we base the phase/component flows on a stock tank model. That is, the fractions for the well fluid as a whole may be determined by averaging the fractions of all inflows, and then that split is applied to all outflows.
4. To obtain the fracture component flows into the well through each wellbore iso node, we sum all flows obtained in the previous two steps and attribute fractions according to the relative drawdowns of the wellbore nodes.

The conductances between internal and external nodes are calculated time-implicitly, while those between two internal nodes are updated time-explicitly.

As usual, we allow for hydrostatic adjustment $h_{ij} \equiv \rho_{ij}(d_i - d_j) = -h_{ji}$ between node depths $d_i$ and $d_j$. The well fluid density is an explicit quantity in the dynamic reservoir model. Hence, it lags behind one time step.

In step 2, we use the bulk component-in-phase mobilities of the respective cells in calculating the inflows into the fracture. Thus the solution can be considered first order multi-component multi-phase. For outflows we use the wellbore mobilities once all producing well connections have been summed up.

Solution Procedure

Figure 1:
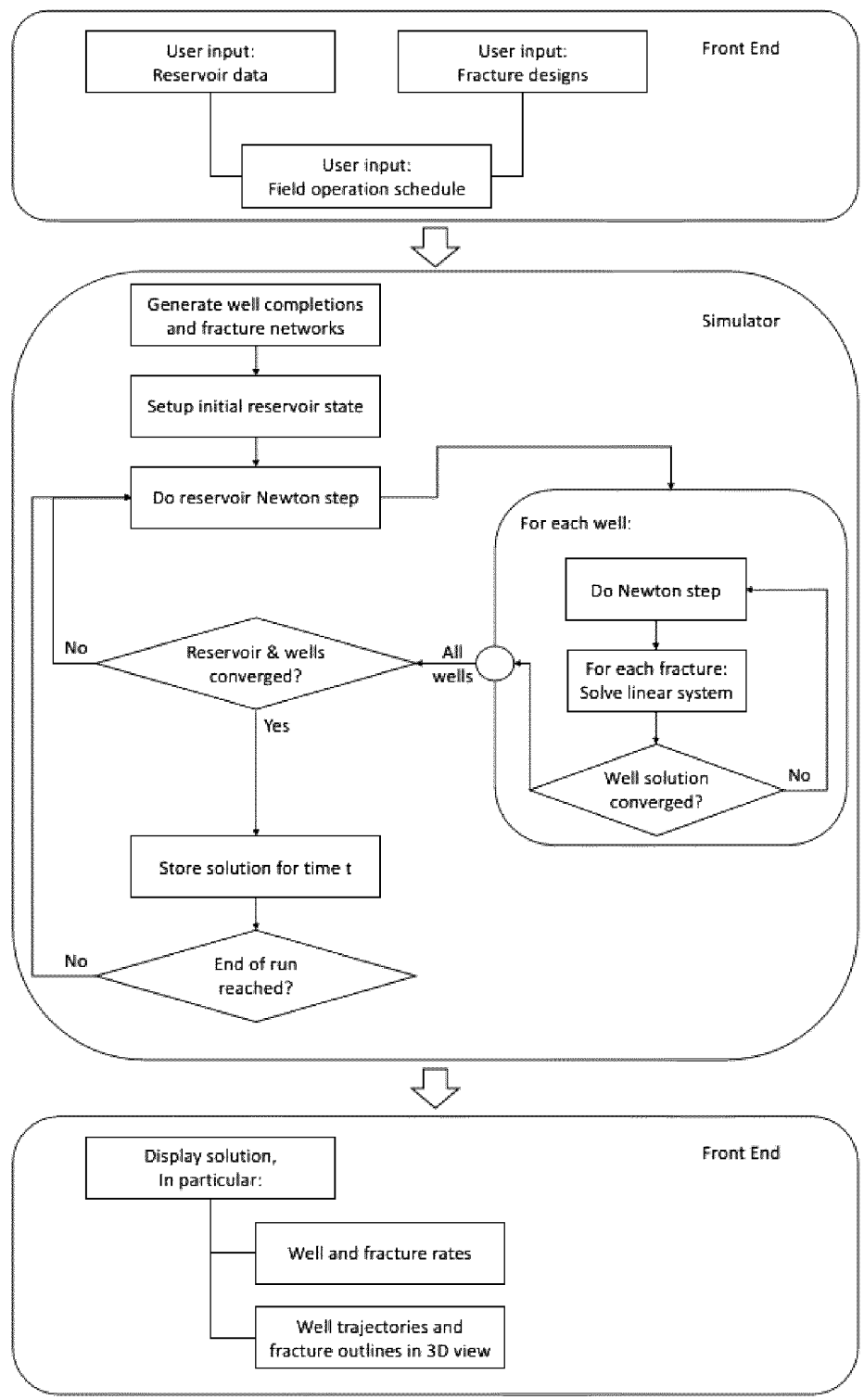
FIG. 1 illustrates the process used according to the invention.

In order to accomplish step 1, observe that mass conservation (or rather voidage conservation under the incompressibility assumption) requires $$\sum_{j \in N(i)} \dot{V}_{ji} = \{0, -\dot{V}_i^e\} \quad (3)$$

to hold at internal and external nodes, respectively, where N(i) denotes the topological neighbourhood of node i. Inserting FIG. 1 into the l.h.s. of FIG. 3 gives $$-\{0, -\dot{V}_i^e\} = \sum_j \mu_{ij}(p_i - p_j) - \sum_j \mu_{ij} h_{ij} = p_i \sum_j \mu_{ij} - \sum_j \mu_{ij} p_j - \sum_j \mu_{ij} h_{ji}^T.$$

Let the $N^i$ internal and $N^e$ external node indices be sorted as $\{1, \ldots N^i, \ldots N^i + N^e\}$. In shorthand notation, the combined equations (1) and (3) read $$\begin{pmatrix} 0^{(N^i)} \\ \dot{V}^{ex} \end{pmatrix} + \text{diag}(M \cdot H^T) = [-M + \text{diag}(M \cdot e)] \begin{pmatrix} p^{in} \\ p^{ex} \end{pmatrix}. \quad (4)$$

Here, H denotes the matrix of hydrostatic head differences and M denotes the conductance matrix, i. e. it evaluates to $\mu_{ij}$ for neighbouring nodes i, j and zero otherwise. The term diag(M·e) is the diagonal matrix of row sums of M.

The system (4) is semi-decoupled in that the first $N^i$ dimensions can be solved 170 independently from the last $N^e$ dimensions, and the solution $p^{in}$ of the former can then be inserted into the latter system to directly calculate $\dot{V}^{ex}$. So the computational cost is determined by $N^i$.

To be precise, consider the following split into fracture and reservoir parts:

$$-M + \text{diag}(M \cdot e) = \begin{pmatrix} F^U & R^U \\ F^L & R^L \end{pmatrix}, \quad (5)$$

where $F^U$ is an $N^i \times N^i$ matrix, and the other are consequently of dimensions $\dim(R^U) = N^i \times N^e$, $\dim(F^L) = N^e \times N^i$, and dim $(R^L) = N^e \times N^e$. Note that $R^L$ is diagonal and $F^L = (R^U)^T$. Since $R^U p^e$ does not contain any unknowns, the first $N^i$ equations of the system (4) read $$\text{diag}(M \cdot H^T)|_1^{N^i} - R^U p^e = F^U p^{in}. \tag{6}$$

Internal Pressures

We solve for the internal node pressure vector $p^{in}$ as follows:
1. Solve $$Lz = \text{diag}(M \cdot H^T)|_1^{N^i} - R^U p^e \tag{7}$$

for z by forward-substitution.
2. Solve $$L^T p^{in} = z \tag{8}$$

by backward-substitution.

In equations (7) & (8), L denotes the lower triangular matrix defined by the Cholesky decomposition $$F^U = L \cdot L^T. \tag{9}$$

Mathematical Prerequisite

The main algorithmic task lies in decomposing matrix $F^U$. The voidage mobility of any real fluid being positive, it must hold that $\mu_{ij} = \mu_{ji} \geq 0$ and $\mu_{ii} = 0 \forall i$. Hence, $F^U$ follows to be a positive definite matrix which we can always decompose by an efficient Cholesky algorithm.

Alternative Calculation of Voidage Rates for Pure Injectors

In the case of non-crossflowing injectors, only the external network voidage flows $q^e$ are required. So the internal pressures need not be calculated explicitly. From FIG. 4 we find $$q^e = F^L p + R^L p^e - \text{diag}(M \cdot H^T)|_{N^i+1}^{N^e} \tag{10}$$

We see that the internal pressures p can be eliminated in order to find the linear functional $q^e[p^e]$ $$q^e = F^L (F^U)^{-1} \left( \text{diag}(M \cdot H^T)|_1^{N^i} - R^U p^e \right) + R^L p^e - \tag{11}$$

$$\text{diag}(M \cdot H^T)|_{N^i+1}^{N^e} = [R^L - F^L (F^U)^{-1} R^U] p^e +$$

$$\begin{pmatrix} F^L (F^U)^{-1} & 0 \\ 0 & -\mathbb{1}_{N^e} \end{pmatrix} \text{diag}(M \cdot H^T).$$

We can avoid explicit inversion of $F^U$ altogether in order to evaluate FIG. 11 by calculating the following terms separately using the identity $(L \cdot L^T)^{-1} = (L^T)^{-1} \cdot L^{-1} = (L^{-1})^T \cdot L^{-1}$:
1. $Y = L^{-1} \cdot R^U$ by substitution in the column vector equations $L y_j = r_j^U$. And since $F^L = (R^U)^T$, we find $$F^L (F^U)^{-1} R^U = Y^T \cdot Y \tag{12}$$

2. $z = L^{-1} \text{diag}(M \cdot H^T)|_1^{N^i}$ by substitution in the system $Lz = \text{diag}(M \cdot H^T)|_1^{N^i}$. Hence, $$F^L (F^U)^{-1} \text{diag}(M \cdot H^T)|_1^{N^i} = Y^T z. \tag{13}$$

With these terms at hand, FIG. 11 simplifies to $$q^e = (R^L - Y^T \cdot y) p^e + Y^T z - \text{diag}(M \cdot H^T)|_{N^i+1}^{N^e}. \tag{14}$$

Multi-Phase and Multi-Component Flows

Once the internal node pressures are known, we determine the component rates directly from the set of drawdowns $p_j^e - p_i - \rho_{ji}(d_j - d_i)$ utilising the two-point multi-component multi-phase flow expressions applied throughout the well solver. In order to calculate the flow derivatives with respect to the well bhp, we merely need the drawdown derivatives which are simply given by $\partial p_i / \partial p_j^e$ for any of the external nodes j in the wellbore (since the latter only differ by constant heads). Taking the derivative $\partial / \partial p_j^e$ of FIG. 6 reads in index notation:

$$F_{ki}^U \frac{\partial p_i}{\partial p_j^e} = -R_{kj}^U. \tag{15}$$

This equation is solved by the same forward and backward substitution as in equations (7) & (8), i. e.

$$Lz = -r_j \tag{16}$$

$$L^T \frac{\partial p}{\partial p_j^e} = z,$$

where $r_j$ denotes the j-th column vector of $R^U$.

Near Wellbore Modelling

The flow pattern far from the wellbore is assumed to be characterised by streamlines being perpendicular to the fracture plane. However, in particular for fractures along vertical wells, this assumption breaks down near the wellbore. Given the wellbore 220 radius an analytic approximation can be used to evaluate the deviation of the streamlines from the normal, which then enters (2) via the connectivity factors $ccf_j$ of the reservoir nodes according to their distance from the well. Likewise, the radial inflow directly into the wellbore (not through the fracture) is affected by the deviation of the streamlines from their unperturbed radial direction at the well radius. This effect can be taken into account by modifying the radial ccf appropriately.

Incorporating Non-Linear Effects

One can argue that multi-phase and non-Darcy effects are most prominent in the near wellbore region where the pressure changes appreciably, while the flow inside the fracture can be well approximated by the linear calculation above. To a good approximation, for a horizontal fracture, the flow pattern close to the well is radially symmetric no matter what the fracture looks like. Hence, the non-linear problem boils down to solving the flow in a disc, given boundary conditions at some outer effective well radius and the wellbore pressure at the inner radius. I. e. there exists some non-linear function $$q = q(p_{bh}, p_{well}^e), \tag{17}$$

containing one of the external pressures (the node at the wellbore of the linear problem in the previous section. This modelling is most relevant for horizontal wells where there is really only one network node close to the well—in contrast to the sketch of a vertical well in FIG. 2. The well fracture is then solved by satisfying the condition $$q_{well}^e \stackrel{!}{=} q(p_{bh}, p_{well}^e), \tag{18}$$

which can be done by Newton's method or bisection. It is sped up by the fact that $q_{well}^e$ linearly depends on $p_{well}^e$ and thus requires only straightforward calculation.

Coupling with External Fracture Modelling Tools

The flexible design of this well fracture modelling facility both in terms of the user interface and the internal algorithm allows coupling with external fracture modelling tools. These could be used to supplement it with high-resolution fracture data such as orientation, height, width and permeability along the fracture. In return, results from the flow simulation could be fed back into the external tools to dynamically adjust the fracture properties in order to further enhance the accuracy of the combined model.

SUMMARY

To summarize, the present invention relates to a method for calculating flow conditions in fractures in the vicinity of a well bore. The well fracture being defined by a two-dimensional network of network nodes and links describing the network of flow paths intersecting a geological formation. The nodes include internal and external nodes with links between internal nodes describing the flow within the network and links between internal and external nodes describing the flow into or out of the network. The well fracture thus allowing a fluid flow between said formation grid cells and the fracture, and from the fracture to the well. The geological formation may be defined in terms of three-dimensional grid cells including a set of fracture properties, the fracture properties are defining all available well fracture properties, involving geometrical data and fluid characteristics. The information may for example be provided through a graphical user interface or a textual definition file The method includes the steps of:
a) iterative solution of the well flows contingent on boundary conditions from the formation, the well bottom hole pressure being adjusted from one iteration to the next until all well constraints are satisfied to a given precision or iteration number.
b) at each iteration, this involves a non-iterative solution of the fracture flows contingent on the well pressures and the boundary conditions from the formation grid cells, the pressure solution, being based on a linear system of equations for the voidage flows in the fracture defined by the single phase Darcy flow between neighboring network nodes, defines the individual drawdowns for each cell-fracture connection determining the component rates between the formation and the fracture.

Preferably the method utilizes the application of non-linear models to affect the boundary conditions mentioned in step, and the adjustments of well pressure values in a) may involve a Newton iteration process.

The well constraint data may include individual pressure fluid composition data for each grid cell. The given precision of the well constraints is preferably within a threshold defined by a relative deviation of $10^{-6}$ or the iteration may be stopped after a number of iterations in the order of $10^2$.

The network nodes include external nodes with links to internal nodes describing the flow from the reservoir to the two dimensional network, wherein for each external node being associated with a reservoir cell having a positive drawdown, calculating the phase/component flows to the adjacent internal node from the drawdowns determined in step and the said cell properties.

For each external node associated with a reservoir cell having a negative drawdown, the phase/component flows are based on a stock tank model where the fractions for the well fluid as a whole may be determined by averaging the fractions of all inflows, and then that split is applied to all outflows.

The fracture component flows into the well through each wellbore node, may be found by calculating a sum all flows obtained in the previous two steps and attribute fractions according to the relative drawdowns of the external wellbore nodes.

The static and dynamic properties of well fractures evaluated by application of the method according to the invention may include three-dimensional visualization of the reservoir and wells and well fractures, and plotting of time-dependent phase and component rates for each well fracture.

REFERENCES TO RELATED APPLICATIONS

[1] S. Kennon, S. Canann, S. Ward, and F. Eaton, "Method and system for modeling and predicting hydraulic fracture performance in hydrocarbon reservoirs," Apr. 12, 2011. U.S. Pat. No. 7,925,482. 2

[2] G. Bowen, T. Stone, D. Bradley, and N. Morozov, "Multisegment fractures," Jul. 12, 2016. U.S. Pat. No. 9,390,204. 2

[3] G. Bowen and T. Stone, "Multiphase flow in a wellbore and connected hydraulic fracture," Mar. 25, 2014. U.S. Pat. No. 8,682,628. 2

[4] D. Peaceman, *Fundamentals of Numerical Reservoir Simulation*. Developments in Petroleum Science, Elsevier Science, 2000. 5

What is claimed:

1. Method for calculating flow conditions in fractures in the vicinity of a well bore, the well fracture being defined by a two-dimensional network of nodes and links describing flow paths intersecting a geological formation, the geological formation defined in terms of three-dimensional grid cells and allowing a fluid flow between said formation grid cells and the fracture, and from the fracture to the well, the method includes:
a) iterative solution of the well flows contingent on boundary conditions from the formation, the well bottom hole pressure being varied from one iteration to the next until all of a plurality of well constraints are satisfied to a predetermined tolerance or a chosen iteration number;
b) at each iteration, this involves a non-iterative solution of any fracture flows contingent on the well pressures and the boundary conditions from the formation grid cells, the pressure solution of the linear system of equations for any voidage flows in the fracture defines the individual drawdowns for each of a plurality of cell-fracture connections determining the component rates between the formation and the fracture.

2. Method according to claim 1, including application of non-linear models to affect the boundary conditions mentioned in claim 1, step b.

3. Method according to claim 1, wherein the adjustments of well pressure values in claim 1, step a involves a Newton iteration process.

4. Method according to claim 1, wherein said given precision is in the range of, and preferably within a threshold defined by a relative deviation of $10^{-6}$.

5. Method according to claim 1, wherein said well constraints are defined by data including individual pressure and fluid composition data for each grid cell.

6. Method according to claim 1, wherein the iteration is stopped after a predetermined maximum number of iterations, preferably in the order of $10^2$.

7. Method according to claim 1, wherein said linear set of equations is based on the single phase Darcy flow between neighboring network nodes.

8. Method according to claim 1, wherein the nodes include external nodes with links to internal nodes describing the flow from the formation into the network, the method including a step of, for each external node associated with a reservoir cell having a positive drawdown, calculating the phase/component flows to the adjacent internal node from the drawdowns determined in claim 1, step b and the said cell properties.

9. Method according to claim 1, wherein the nodes include external nodes with links to internal nodes describing the flow from the network into the formation, the method including a step of, for each external node associated with a reservoir cell having a negative drawdown, the phase/component flows are based on a stock tank model where the fractions for the well fluid as a whole are determined by averaging the fractions of all inflows, and then that split is applied to all outflows.

10. Method according to claim 1, wherein the fracture component flows into the well through each wellbore node are found by calculating a sum over all flows obtained in the previous two steps and attributing fractions according to the relative drawdowns of the wellbore nodes.

11. Method of displaying the static and dynamic properties of well fractures evaluated by application of method described in claim 1, including three-dimensional visualisation of the reservoir and wells and well fractures, and plotting of time-dependent phase and component rates for each well fracture.

* * * * *